(12) United States Patent
Yagi

(10) Patent No.: US 6,267,608 B1
(45) Date of Patent: Jul. 31, 2001

(54) OPENING AND CLOSING STRUCTURE FOR A HOUSING COVER OF A CONNECTOR OF AN INFORMATION PROCESSING APPARATUS

(75) Inventor: Yasunari Yagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/397,669

(22) Filed: Sep. 16, 1999

(30) Foreign Application Priority Data

Sep. 21, 1998 (JP) ................................. 10-266406

(51) Int. Cl.⁷ .................................................. H01R 13/44
(52) U.S. Cl. ............................................ 439/142; 439/910
(58) Field of Search ..................................... 439/142, 910, 439/136, 271, 135, 207, 211, 212, 213, 131, 501, 535; 174/49, 48; 361/727, 648, 616, 683

(56) References Cited

U.S. PATENT DOCUMENTS

| | | | | |
|---|---|---|---|---|
| 5,036,313 | * | 7/1991 | Lin et al. | 340/700 |
| 5,247,285 | * | 9/1993 | Yokota et al. | 345/169 |
| 5,306,178 | * | 4/1994 | Huang | 439/536 |
| 5,415,557 | * | 5/1995 | Chapman et al. | 439/142 |
| 5,501,607 | * | 3/1996 | Yoshioka et al. | 439/142 |
| 5,552,967 | * | 9/1996 | Seto | 361/818 |
| 5,571,023 | * | 11/1996 | Anthony | 439/142 |
| 5,574,625 | * | 11/1996 | Ohgami et al. | 361/684 |
| 5,844,772 | * | 12/1998 | Lee et al. | 361/683 |
| 5,980,279 | * | 11/1999 | Muller | 439/142 |
| 6,017,228 | * | 1/2000 | Verbeek et al. | 439/142 |

FOREIGN PATENT DOCUMENTS 2-213072   8/1990   (JP) .

\* cited by examiner

*Primary Examiner*—Neil Abrams
*Assistant Examiner*—J. F. Duverne
(74) *Attorney, Agent, or Firm*—Foley & Lardner

(57) ABSTRACT

In an opening and closing structure for a connector housing cover in an information processing apparatus, a viewing window is formed at the upper surface of a housing recess that houses a connector in the main unit of a information processing apparatus, and a connector housing cover is mounted to cover the housing recess that houses the connector, so that when the connector housing cover is opened, the upper surface viewing window is opened, enabling viewing of a connector cable while it is being connected.

10 Claims, 11 Drawing Sheets

OPENING AND CLOSING STRUCTURE FOR A HOUSING COVER OF A CONNECTOR OF AN INFORMATION PROCESSING APPARATUS

BACKGROUND OF THE INVENTION

1. Field of the Invention

The present invention relates to a peripheral mechanical structure of a connector of a portable information processing apparatus, and more specifically to an opening and closing structure for a connector housing cover of an information processing apparatus.

2. Description of the Related Art

In order to enable the use of portable information processing apparatuses in a variety of remote locations, there is the requirement that connectors be mated and removed frequently. In the past, to protect connectors of information processing apparatuses, a connector housing cover 1 such as shown in FIG. 11 had been proposed. In this drawing, the main unit of an information processing apparatus 2 is provided with a recess 4 on its rear panel that has a connector 3. The top cover 4a of this recess 4 is closed, making it impossible to directly view the connector from directly above.

In the prior art embodiment that is shown in FIG. 11, the connector housing cover 1 is hinged at the edge 1a with respect to the lower edge 4b of the recess 4 that is formed in the information processing apparatus main unit 2.

Therefore, when the connector housing cover 1 is opened, this connector housing cover is open to the table or the like on which the information processing apparatus rests.

In another example of the prior art, a connector housing cover opening and closing structure such as shown in FIG. 12 has been proposed. In this prior art embodiment, a recess 6 having a connector 3 is formed in the rear panel of the information processing apparatus 5. The recess 6 is open at the rear and at the top of the information processing apparatus 5. The connector housing cover 7 is joined by a hinge at the edge 7a thereof with respect to the information processing apparatus 5.

The connector housing cover 7 has a surface 7c that is perpendicular to the surface 7b of the connector housing cover 7 that is joined by a hinge to the information processing apparatus 5, this surrounding and covering the rear of the recess 6.

Another connecting apparatus for an information processing apparatus was proposed and disclosed in the Japanese Unexamined Patent Publication (KOKAI)No. 2-213072. In this disclosure, the housing of lead wires and conductors at prescribed positions within a connector is verified visually, after which a downward pressure piece causes the lead wire conductors to make a pressure contact with a relay connector.

All of the above-described prior art connector housing covers for information processing apparatuses, however, are accompanied by problems.

Specifically, the first problem is that, as shown in FIG. 11, the structure is one of a single connector housing cover 1 being opened and closed, and it is not possible for a user to mate the connector cable into the connector while viewing the connector terminals, making the task of connecting the connector extremely difficult. In the case in which an information processing apparatus is located near a wall surface, it is particularly difficult to make connection to a connector cable.

The reason for this is that the vision of the user is blocked by the information processing apparatus or the connector housing cover.

The second problem is that the dressing of the cable which is connected to the connector terminals is difficult.

Accordingly, it is an object of the present invention to improve on the above-noted drawbacks of the prior art, by providing a connector housing cover opening and closing structure for an information processing apparatus, that enables a connector terminated cable to be mated to or to be removed from a rear panel connector while observing from above.

SUMMARY OF THE INVENTION

In order to achieve the above-noted objects, the present invention adopts the following basic technical constitution.

Specifically, the first aspect of the present invention is an opening and closing structure for a connector housing cover of an information processing apparatus, in which a viewing window is formed in the upper surface of a recess that houses the connector on the main unit of an information processing apparatus, a connector housing cover being mounted which covers the recess that houses the connector and the above-noted viewing window, so that when the connector housing cover is opened, the viewing window is opened. In the second aspect of the present invention, the above-noted connector housing cover is slid and housed within a portable information processing apparatus.

In order to solve the above-noted problems associated with the prior art, the opening and closing structure of a connector housing cover of an information processing apparatus according to the present invention has formed in it a viewing window which enables viewing of the information processing apparatus connector from the top, and has mounted a connector housing cover that covers the above-noted viewing window and above-noted information processing apparatus connector, so that when the connector housing cover is opened, the upper surface viewing window is opened, thereby enabling the user to mate or remove the connector cable from the information processing apparatus while viewing the connector.

DESCRIPTION OF THE PREFERRED EMBODIMENTS

Embodiments of an opening and closing structure of a connector housing cover for an information processing apparatus according to the present invention will be described in detail below, with references being made to relevant accompanying drawings.

Figure 1:
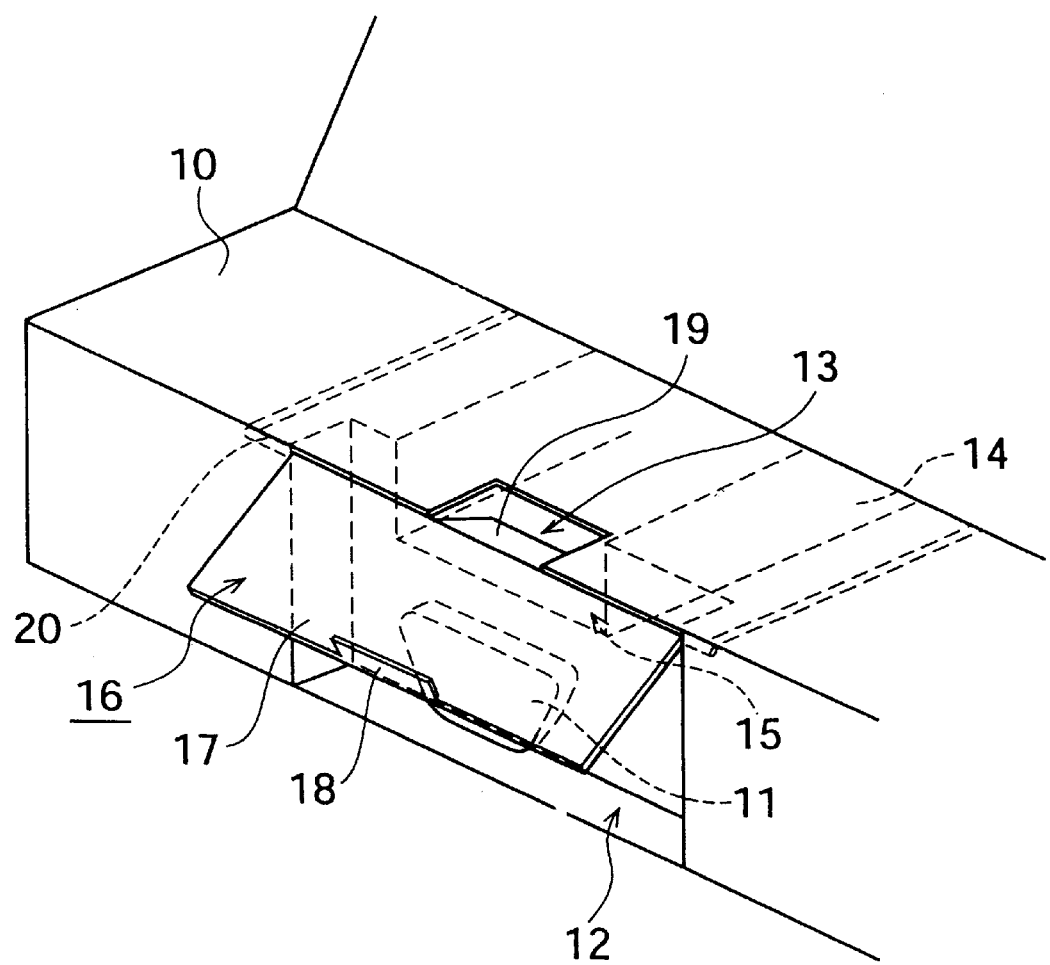
FIG. 1 is a perspective view of the rear panel of a portable information processing apparatus, which shows the first embodiment of a connector housing cover opening and closing structure for an information processing apparatus according to the present invention, this drawing showing the condition in which the connector housing cover has begun to open.

FIG. 1 is a drawing that shows an embodiment of an opening and closing structure of a connector housing cover of an information processing apparatus according to the present invention, in which a viewing window is formed in the upper surface of a housing recess that houses the connector of an information processing apparatus, and in which a connector housing cover is mounted that covers the above-noted viewing window and a recess which houses the above-noted connector, so that when the connector housing cover is opened, the above-noted viewing window is opened.

The information processing apparatus 10 has formed on its rear panel a housing recess 12 that has a connector 11. The ceiling part (upper surface) of the housing recess 12 has formed in it a viewing window 13. The housing recess 12 communicates with a cover body housing recess 14 that is wider than the housing recess 12 and with a viewing window 15.

Figure 2:
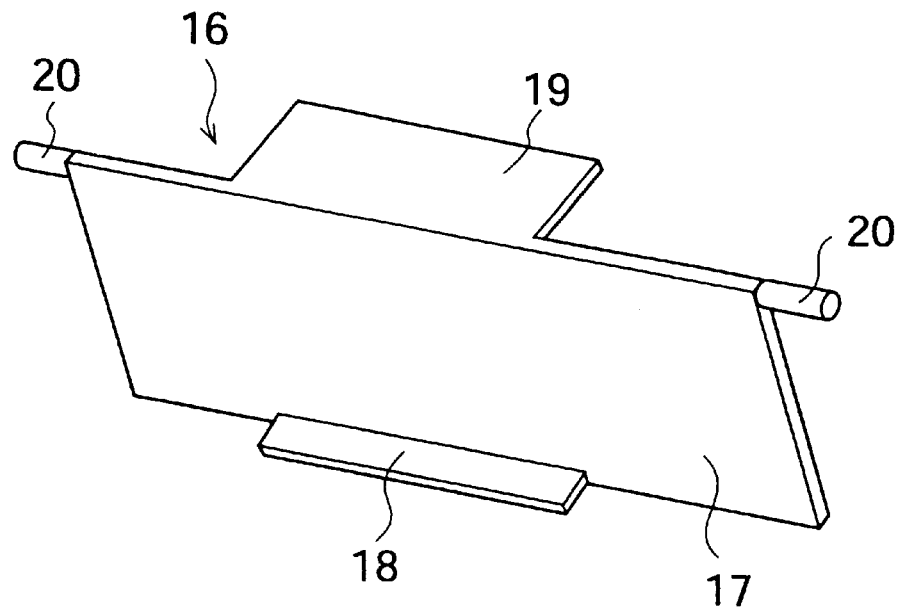
FIG. 2 is a perspective view of a connector housing cover that is used in the opening and closing structure of a connector housing of an information processing apparatus according to the present invention.
Figure 3:
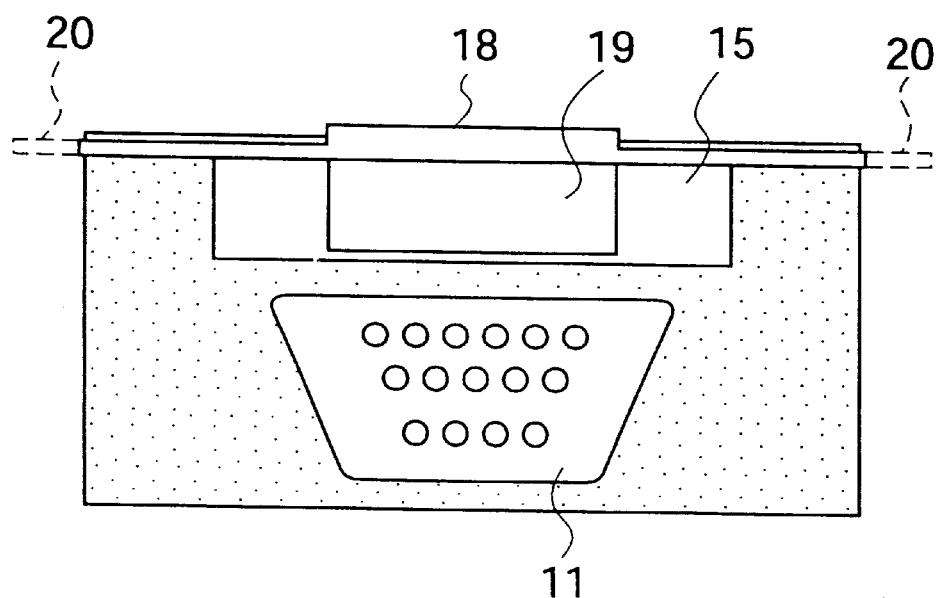
FIG. 3 is a front view of the main part of the opening and closing structure of a connector housing cover for an information processing apparatus according to the present invention, shown in the opened condition.

The connector housing cover 16, as shown in FIG. 2, is formed by a cover body 17 which covers the housing recess 12, a grabbing piece 18 that is formed at the lower edge of the cover body 17, a viewing window cover 19 that covers the viewing window 13, and a pivoting shaft 20 that protrudes from the left and right sides of the cover body 17. The widths of the grab piece 18 and the viewing window cover 19 are formed so as to be nearly the same, and so that they can be fit into the viewing window 13. A connector housing cover 16 with the above-noted structure, as shown in FIG. 1, is built into an information processing apparatus.

The viewing window 13 is formed so as to be slightly larger than the viewing window cover 19, so that it can house the viewing window cover 19. The pivoting shaft 20 pivotally supports the cover body 17 at the ends of the cover body housing recess (toward the viewer in FIG. 1), and by sliding in the depth direction, it is possible to house the cover body 17 within the cover body housing recess 14.

Next, the opening and closing operations of the connector housing cover of a information processing apparatus having the configuration described above will be described. When the connector housing cover 16 is in the closed condition, the cover body 17 covers the housing recess 12 of the information processing apparatus 10, and the viewing window cover 19 covers the viewing window 13, thereby protecting the connector terminals.

Figure 4:
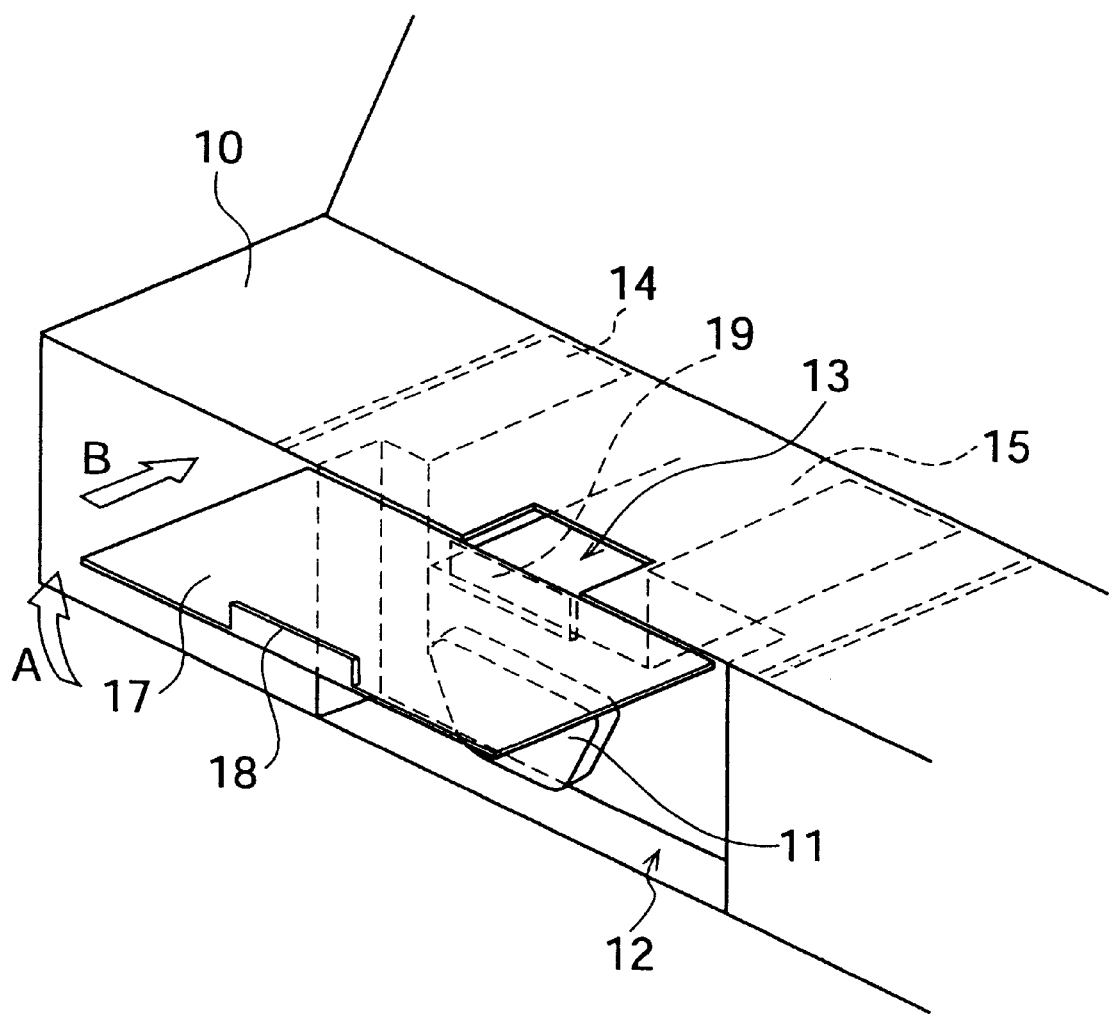
FIG. 4 is a drawing that illustrates the cover opening operation of the same opening and closing structure of a connector housing cover for an information processing apparatus according to the present invention.

As shown in FIG. 1, if the grab piece 18 is held and the connector housing cover 16 is swung about the pivoting shaft 20, the viewing window cover 19 swings downward, so that the viewing window 13 opens at the upper surface of the housing recess 12. If, as shown in FIG. 4, the connector housing cover 16 is swung in the direction of the arrow A until the cover body 17 is horizontal, it is possible to slide it in the direction of the arrow B. When this is done, the cover body 17 is housed within the cover body housing recess 14. By performing this swinging operation, the viewing window which is positioned so as to be vertical, is housed within the viewing window housing recess 15.

Figure 5:
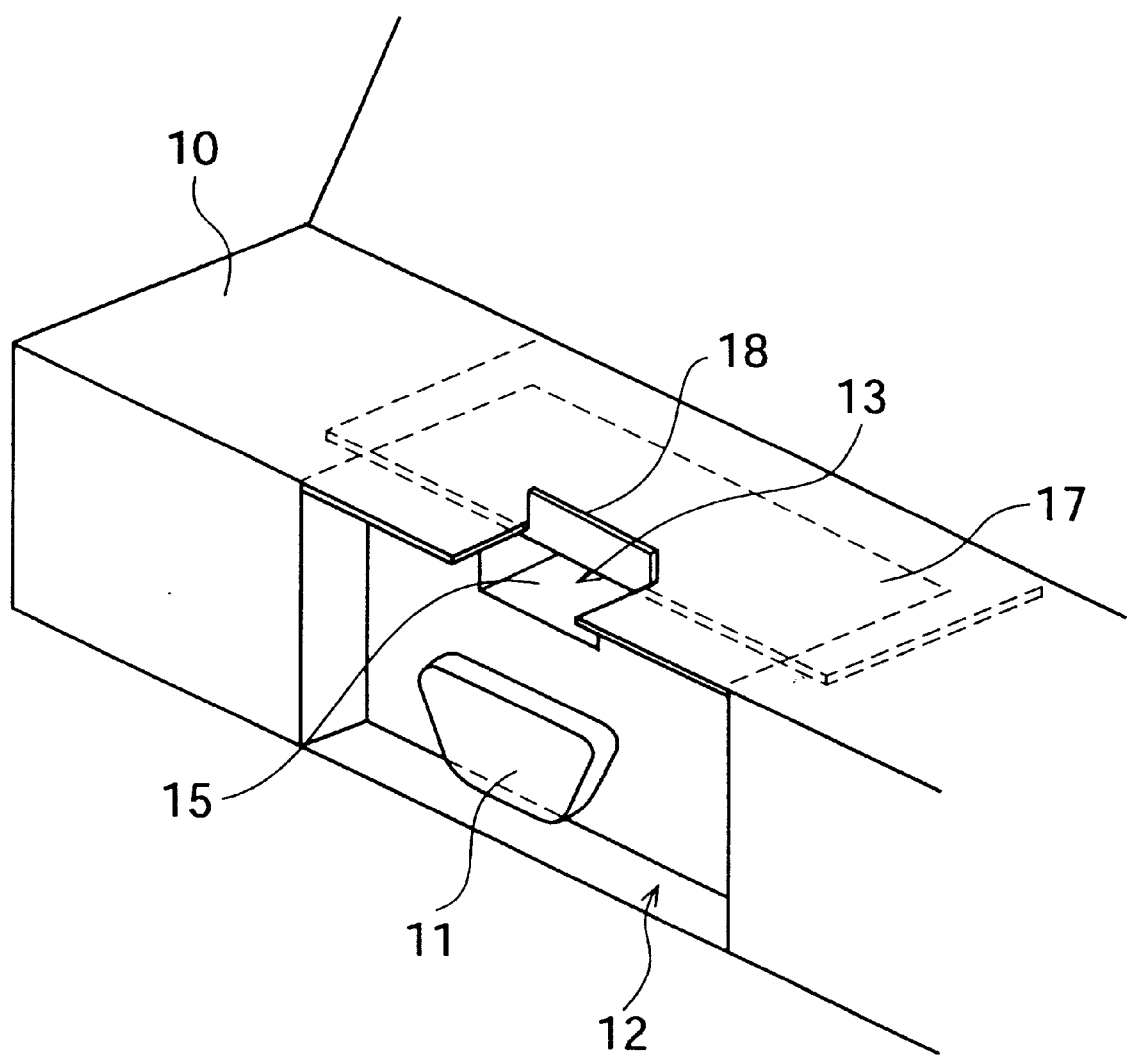
FIG. 5 is a perspective view that shows the condition in which the cover opening operation of the same opening and closing structure of a connector housing cover for an information processing apparatus has been completed.

Additionally, if the connector housing cover 16 is deep to the rear, the grab piece 18 makes contact with the rear edge of the viewing window and stops (refer to FIG. 5). Note that the grab piece 18 has a width that enables housing within the viewing window. At this point, because the connector housing cover 16 is completely open and the viewing window is open at the upper surface, it is possible to make a connection or disconnection of a connector cable to the connector 11. Therefore, it is easy to make a connection or a disconnection of a connector cable without the need to grope around for the connector. Additionally, because the connector housing cover 16 is completely housed within the information processing apparatus main unit 10, it does not present a problem with regard to dressing of cables.

In the case of the closing operation, after the connector cable is removed from the connector 11, after the grab piece 18 is held and pulled forward until the connector housing cover 16 stops, the cover body 17 is swung downward. The cover body 17 covers the opening in the housing recess 12, and the viewing window cover 19 covers the viewing window 13, thereby protecting the connector 11 from dust and the like.

Figure 6:
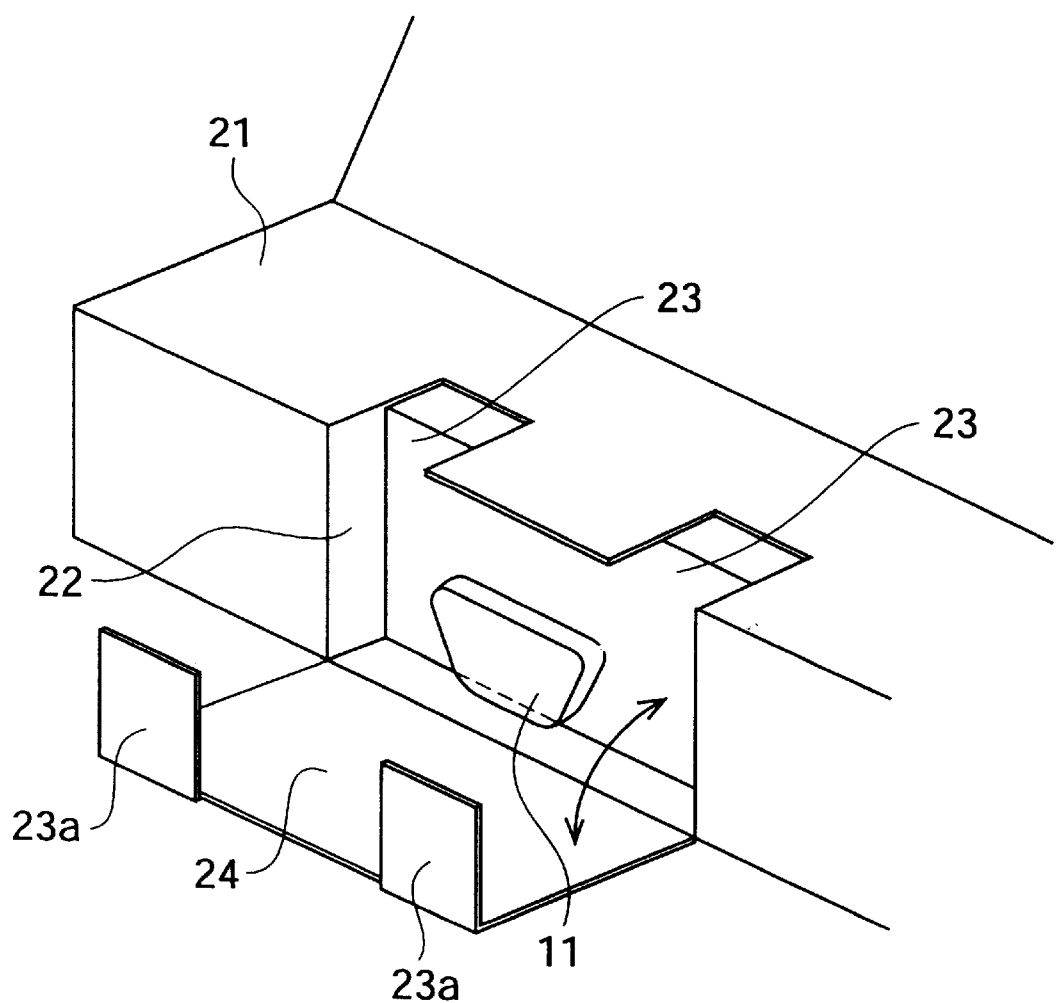
FIG. 6 is a perspective view that shows the second embodiment of the present invention in the condition in which the cover is open.

FIG. 6 is a perspective view that shows a second embodiment of the present invention, in the open condition. In this embodiment, a recess 22 that has a connector 11 of an information processing apparatus main unit 21 has left and right viewing windows 23 in the ceiling part thereof. The left and right viewing windows 23 enable viewing from the left and right edges of the connector 11.

The connector housing cover 24 is joined by a hinge to the lower edge of the opening of the housing recess 22 at the lower edge of the information processing apparatus main unit 21. The connector housing cover 24 has mounted to it viewing window pieces 23a which cover the viewing windows 23 that are formed in the upper surface of the housing recess 22. The viewing window pieces 23a are fixed in an attitude that is perpendicular with respect to the connector housing cover 24. Therefore, when the viewing window 23 is closed, the opening of the housing recess is blocked, as are the left and right viewing windows 23. Because of the opened connector housing cover 24 has the viewing window pieces 23a on its left and right, this does not interfere with dressing of the connected cable.

Figure 7:
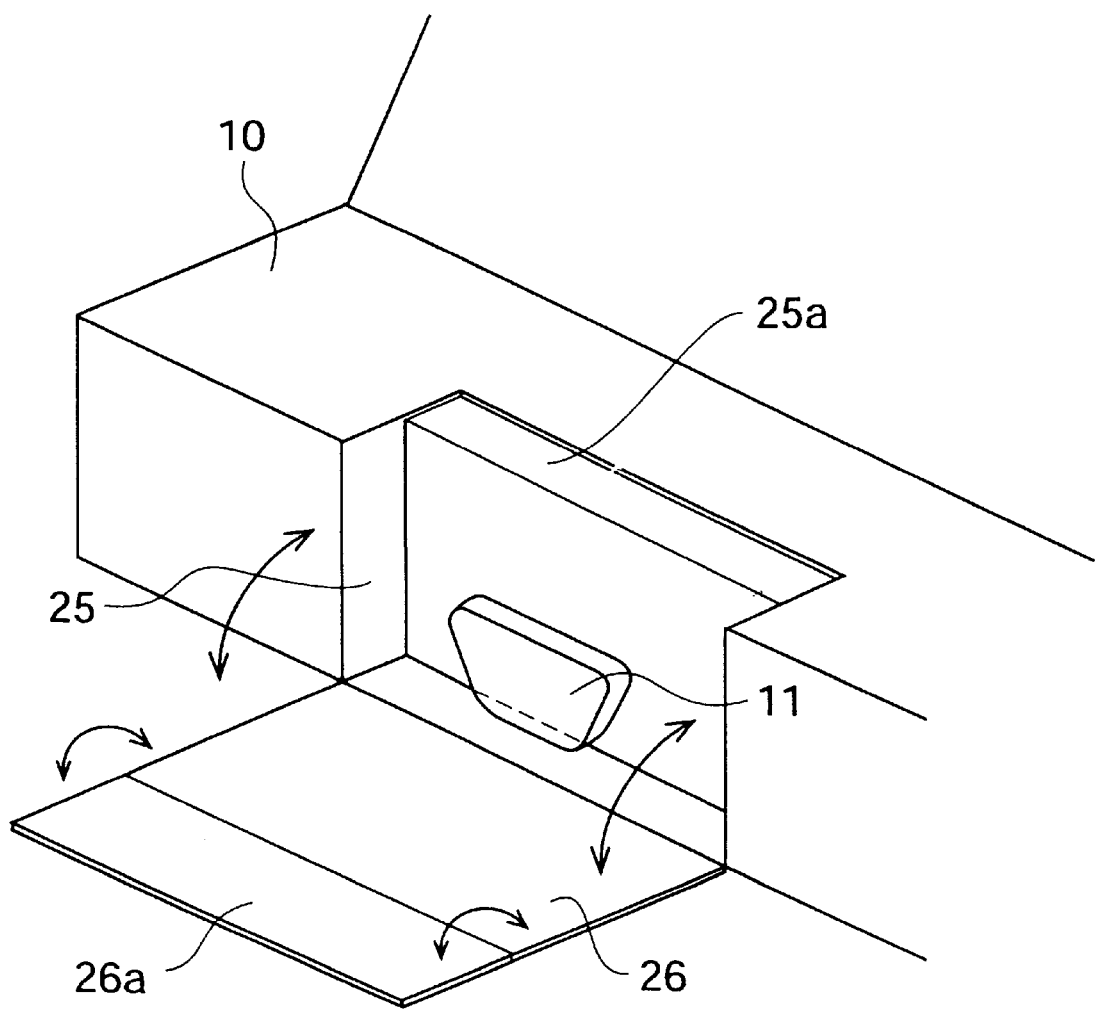
FIG. 7 is a perspective view that shows the third embodiment of the present invention in the condition in which the cover is open.

FIG. 7 is a perspective view of the third embodiment of the present invention in the open condition. In this embodiment, a housing recess 25 that is formed in the information processing apparatus 10 is completely open at the front and top. At the part of the housing recess 25 that communicates with the top, there is a shallow step 25a for the purpose of receiving the closed cover.

At the bottom edge of the opened housing recess 25, the connector housing cover 26 is joined by a hinge. Additionally, at the free edge of the connector housing cover 25, a cover piece 26a that covers the top opening of the housing recess 25 is joined by a hinge.

In the case of the above-noted configuration, because the top part of the housing recess 25 is completely open, it is possible to perform connection or disconnection of a connector while viewing the process, thereby making the task extremely easy. Additionally, when the connector housing cover 26 is opened, the cover is flat, so that it does not interfere with cable dressing.

Figure 8:
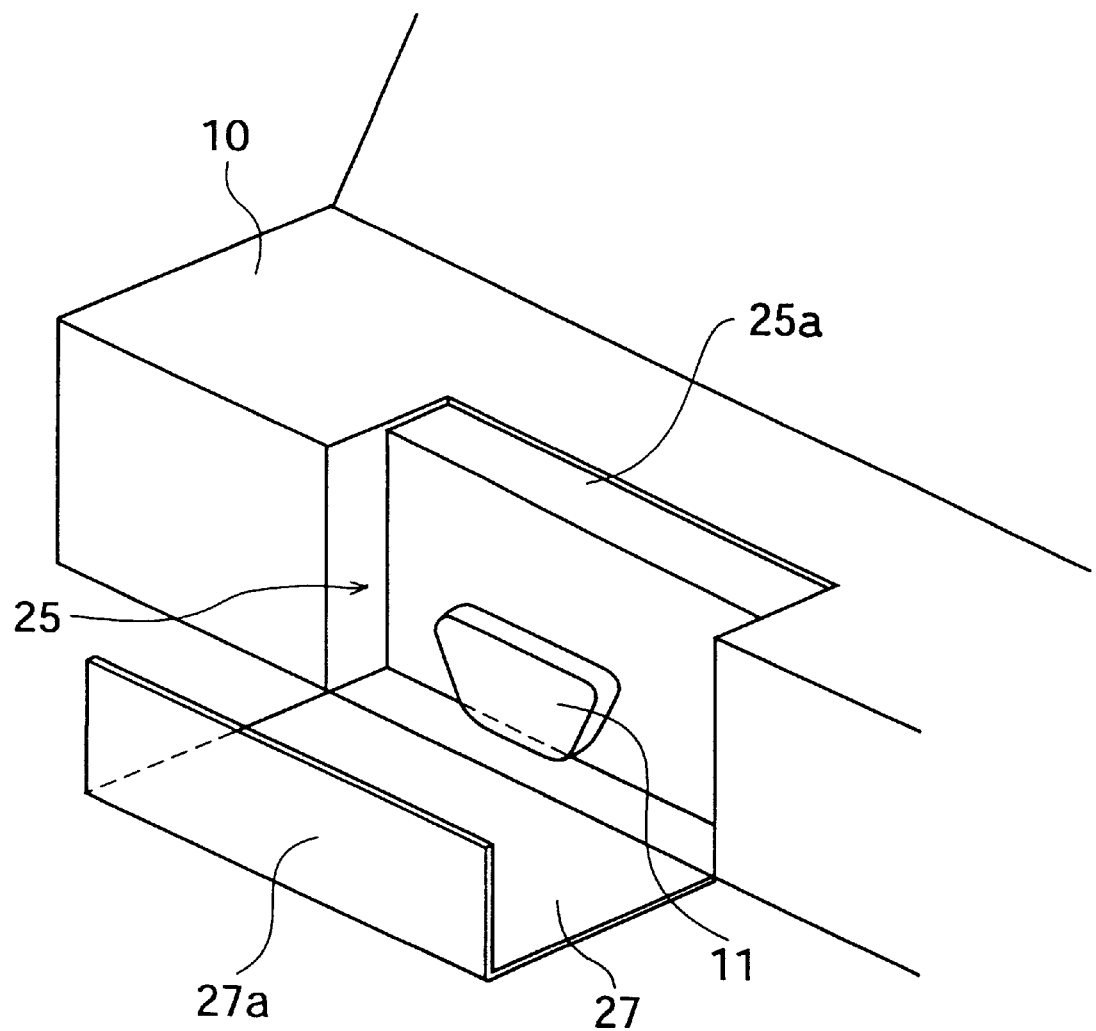
FIG. 8 is a perspective view that shows the fourth embodiment of the present invention in the condition in which the cover is open.

FIG. 8 is a perspective view of the fourth embodiment of the present invention, shown in the open condition. In this embodiment, the housing recess 25 that is formed on the information processing apparatus main unit 10 is completely open at the front and top. At the part of the housing recess that communicates with the top, there is a shallow step 25a for the purpose of receiving the closed cover. At the lower edge of the opening of the housing recess 25, a connector housing cover 27 is joined by a hinge. Additionally, at the free edge of the connector housing cover 27 is a cover piece (extension) 27a that covers the opening at the top part of the housing recess 25, and which is perpendicular to the cover 27. In the case of the above-noted configuration, when a connector cable is connected or disconnected, it is easy to view the connector from the top.

Figure 9:
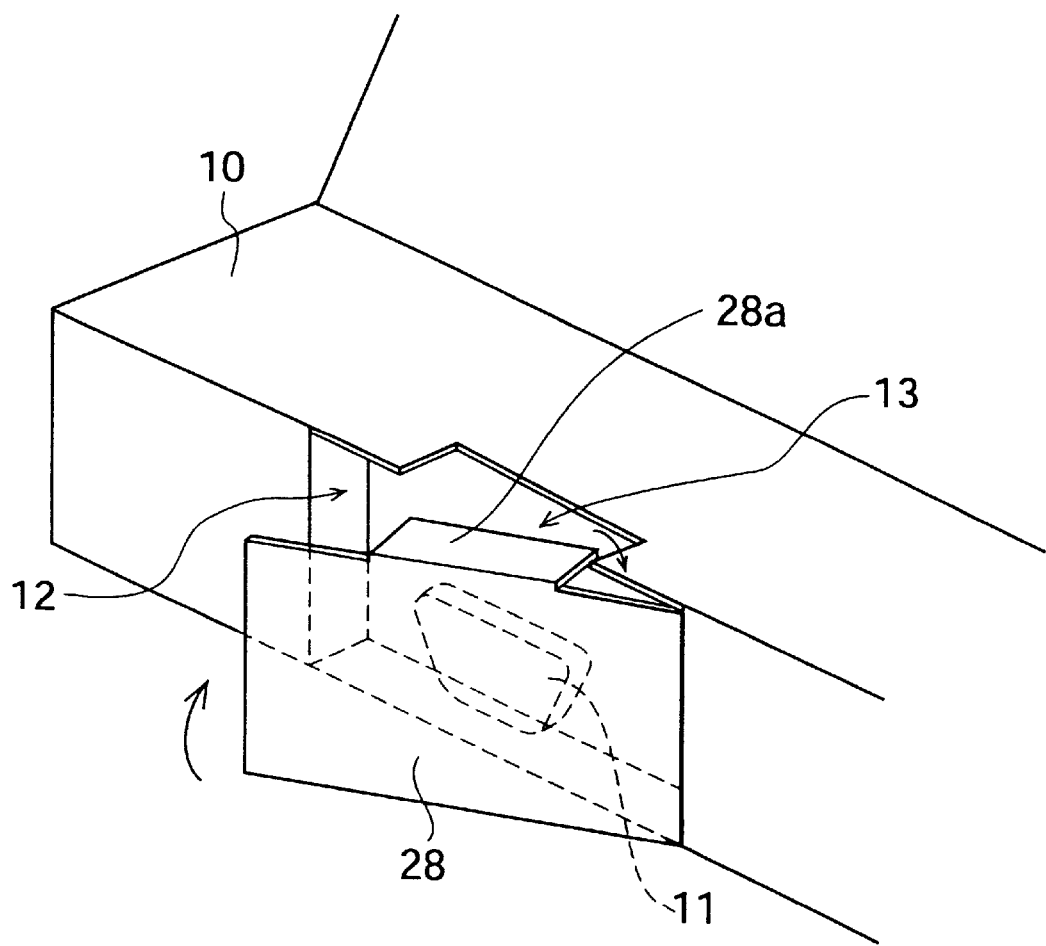
FIG. 9 is a perspective view that shows the fifth embodiment of the present invention.

FIG. 9 is a perspective view that shows the fifth embodiment of the present invention. In this embodiment, a viewing window 13 is formed in the top part of the housing recess 12, and the connector housing cover 28 is joined to a vertical edge of the opening of the housing recess 12 by a hinge. At the center of the top part of the connector housing cover 28, there is a cover piece 28a that covers the viewing window 13, this being joined by a hinge.

In the case of the above-noted configuration, it is possible to open and close the connector housing cover to the side, so that there is no interference to the dressing of cables. Additionally, the viewing window 13 can be blocked by the hinged-joined cover piece 28a when the connector housing cover 28 is closed.

Figure 10:
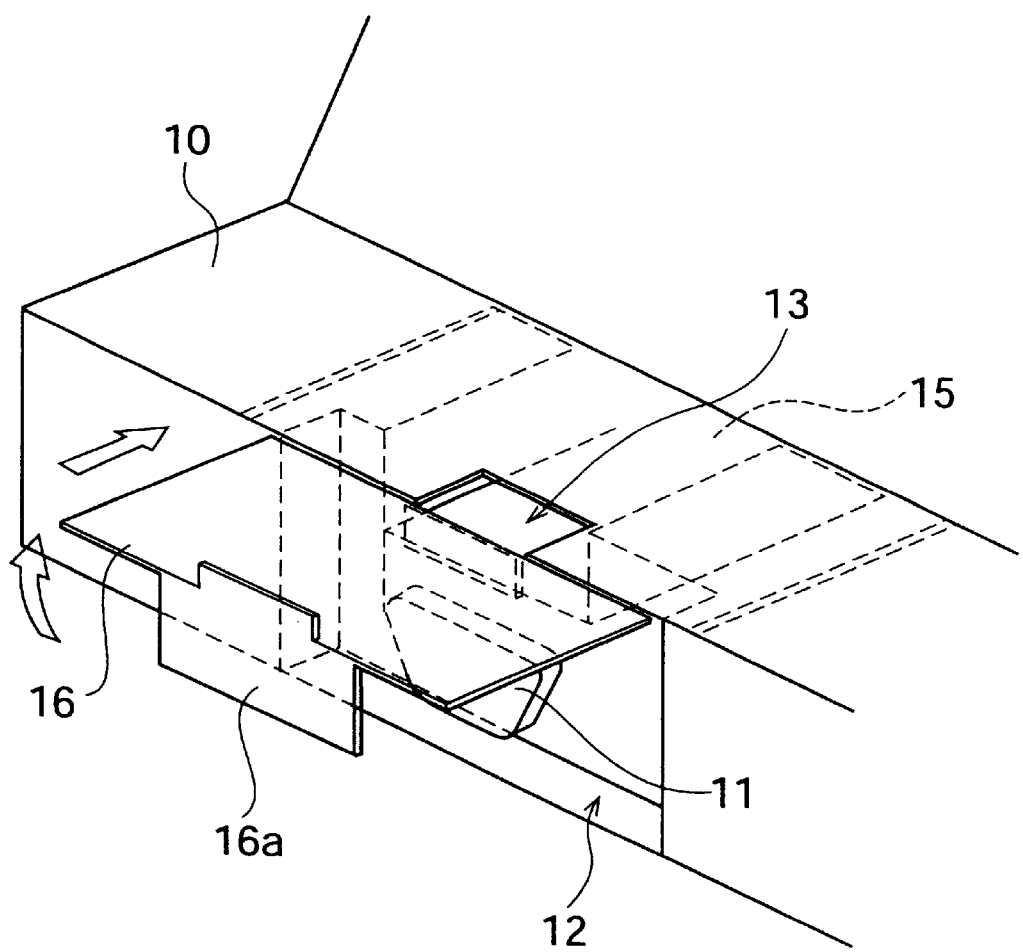
FIG. 10 is a perspective view that shows the sixth embodiment of the present invention.
Figure 11:
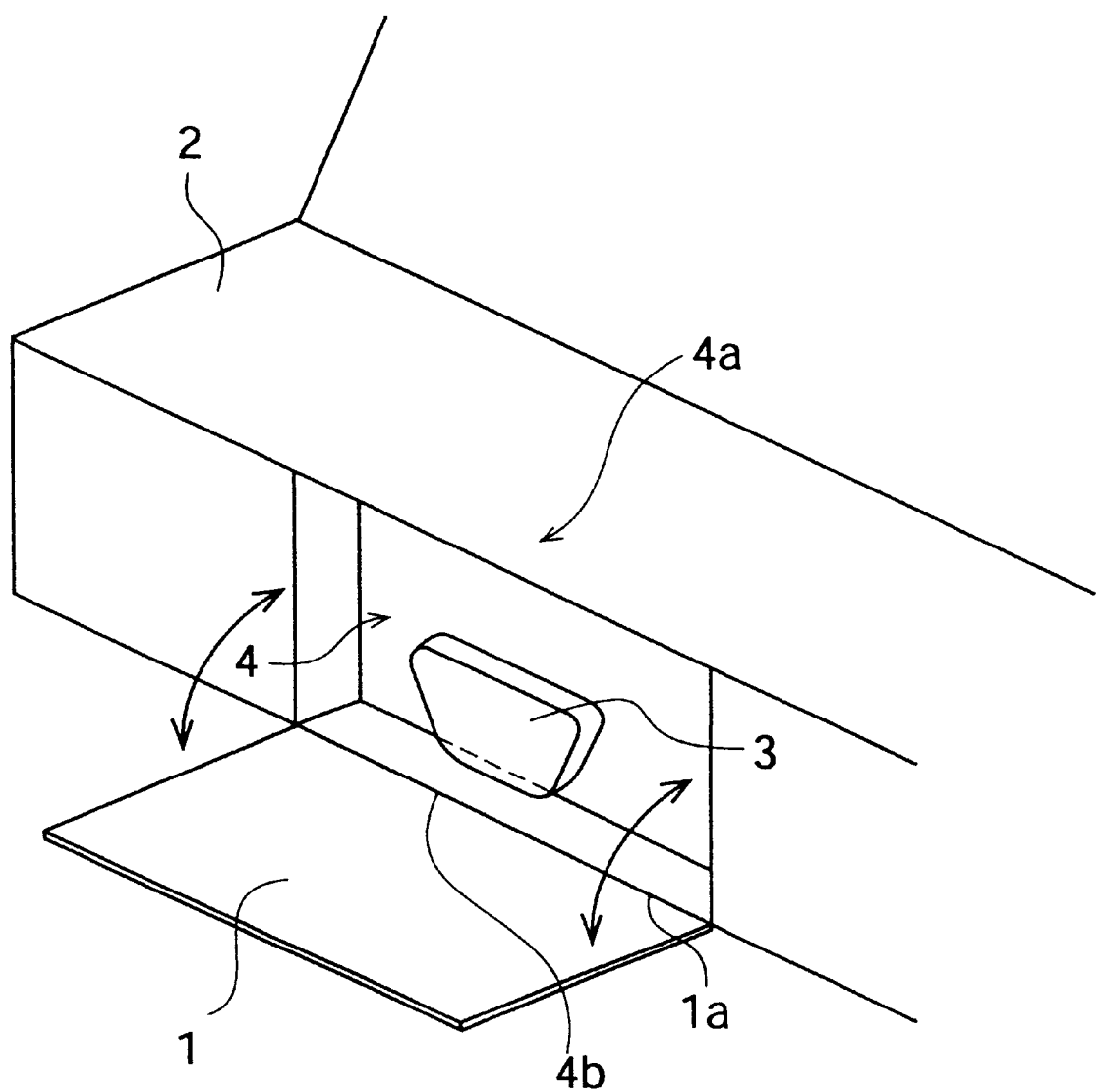
FIG. 11 is a perspective view that shows an example of a connector housing cover for a portable information processing apparatus according to the prior art.
Figure 12:
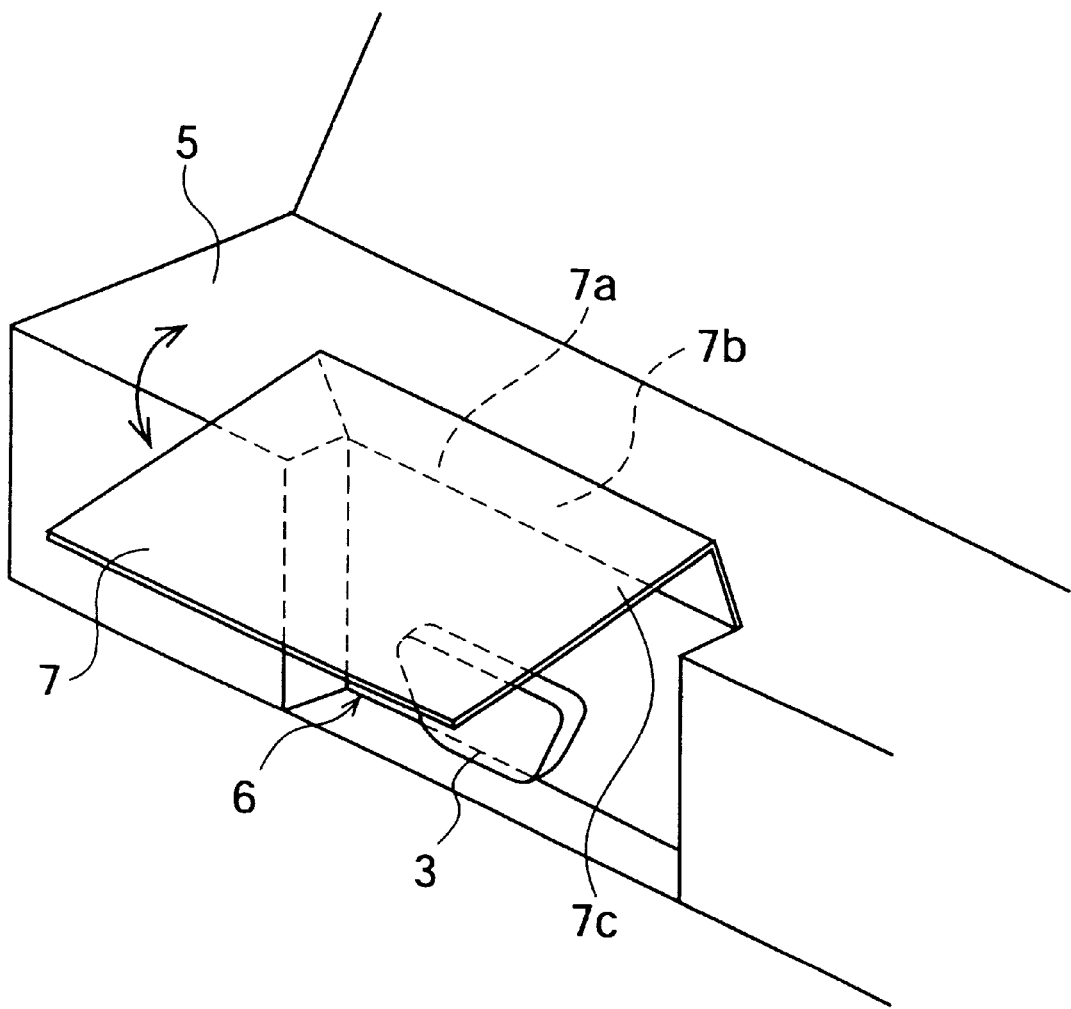
FIG. 12 is a perspective view that shows another example of a connector housing cover for a portable information processing apparatus according to the prior art.

FIG. 10 is a perspective view of the sixth embodiment of the present invention. This embodiment is approximately the same as the first embodiment, except that on the free end of the connector housing cover 16 there is a cover piece 16a that blocks a viewing housing recess 15 that is formed on the main unit of a portable information processing apparatus.

In the case of the above-noted configuration, when the connector housing cover 16 is completely housed in the information processing apparatus main unit 10, because the viewing housing recess 15 is blocked, the intrusion of dust and the like into the information processing apparatus 10 is prevented.

Furthermore, it will be obvious to a person skilled in the art that the present invention is not restricted to the above-noted embodiments, but can take a variety of other forms, based on the technical concept of the present invention.

The first effect of the present invention is that, because the upper viewing window is completely open when the connector housing cover is open, it is possible to view the connector from the viewing window, thereby facilitating the connection and disconnection of a connector. In the past, it was necessary to hunch over a grope behind a piece of information processing apparatus to make a connection to the rear panel thereof. With the present invention, however, it is possible to make perform this task while viewing the connector from above the viewing window. The reason for that is the provision of a viewing window on the upper surface.

The second effect of the present invention is that the opened connector housing cover does not interfere with dressing of cables. The reason for this is that connector housing cover can be fully housed within the information processing apparatus main unit.

The third effect of the present invention is the provision of a viewing window and the imparting of durability even while using a moving part, in the form of a connector housing cover. The reason for this is that it is possible to independently establish the size of the connector housing cover and the size of the viewing window in accordance with the strength that is to be imparted.

What is claimed is:

1. A connector housing cover for movable connection to a main unit of an information processing apparatus, comprising:

a first cover portion to cover a recess formed in the main unit when said connector housing cover is closed and to reveal the recess when said connector housing cover is opened, wherein the connector is housed within the recess; and a second cover portion integrally attached to said first cover portion, wherein when said connector housing cover is closed, said second cover portion covers a viewing window formed in an upper surface of the main unit and through which the connector can viewed, and wherein when said connector housing cover is opened, said second cover portion uncovers said viewing window.

2. The connector housing cover according to claim 1, wherein, when said connector housing cover is open, said connector housing cover is slidable into the main unit of the information processing apparatus so as to be housed therein.

3. The connector housing cover according to claim 2, wherein when said connector housing cover is housed within the main unit of the information processing apparatus, an opening part formed in the main unit of the information processing apparatus is blocked.

4. The connector housing cover according to claim 1, wherein when said connector housing cover is opened, a plurality of viewing windows are formed.

5. The connector housing cover according to claim 4, wherein said plurality of viewing windows are formed in the main unit at left and right sides of the connector.

6. The connector housing cover according to claim 1, wherein said connector housing cover is pivotally connected to the main unit of the information processing apparatus.

7. The connector housing cover according to claim 6, wherein said connector housing cover is connected to the main unit by a hinge, and said first portion and said second portion are integrally connected at the hinge.

8. The connector housing cover according to claim 1, wherein said second portion is perpendicular to said first portion.

9. The connector housing cover according to claim 6, wherein said connector housing cover is connected by a hinge to a vertical edge of the opening in the main unit that provides access to the recess.

10. A connector housing cover according to claim 1, wherein said first cover portion and said second cover are pivotally connected to each other.

* * * * *